United States Patent [19]
Hayashi

[11] Patent Number: 5,724,039
[45] Date of Patent: Mar. 3, 1998

[54] D/A CONVERTER

[75] Inventor: Koji Hayashi, Hashima, Japan

[73] Assignee: Sanyo Electric Co., Ltd., Osaki, Japan

[21] Appl. No.: 815,497

[22] Filed: Mar. 11, 1997

[30] Foreign Application Priority Data

Mar. 14, 1996 [JP] Japan ......................... 8-57709

[51] Int. Cl.$^6$ ................................. H03M 21/08
[52] U.S. Cl. .................................... 341/144
[58] Field of Search ..................... 341/144, 154; 375/22

[56] References Cited

U.S. PATENT DOCUMENTS 4,397,562  8/1983  Shirasu ............................ 368/63

Primary Examiner—Brian K. Young
Attorney, Agent, or Firm—Sheridan Ross P.C.

[57] ABSTRACT

A D/A converter for converting digital data including an appropriate number of bits to an analog value according to the contents of the digital data every a data conversion period. The D/A converter comprises a pulse generating circuit for generating a negative pulse signal and a positive pulse signal at the time of executing the continuous data conversion including an odd order of the data conversion period and an even data conversion period. The negative pulse signal rises after a period specified by the digital data in the odd data conversion period, and it falls in the even data conversion period, wherein a period, which is specified by the digital data, remains in the even data conversion period. The positive pulse signal rises in the odd order of the data conversion period such that a period, specified by the digital data, is remaining in the odd data conversion period, and the positive pulse signal falls after a period specified by the digital data in the even data conversion period. A pulse synthesizer provides a synthesized pulse signal in response to the difference between the negative pulse signal and the positive pulse signal.

4 Claims, 8 Drawing Sheets

D/A CONVERTER

BACKGROUND OF THE INVENTION

1. Field of the Invention

The present invention relates to a digital-to-analog (D/A) converter for converting digital data to an analog signal by pulse width modulation (PWM).

2. Description of the Related Art

While a D/A converter of a PWM type is disadvantageous over a D/A converter of an amplitude modulation (AM) type in its slower conversion speed and greater harmonics deformation, the PWM type D/A converter is advantageous in its higher conversion precision obtained with a relatively simpler circuit structure. Because of this advantage, the PWM type D/A converter is widely used in digital audio apparatus where there is a need for fewer parts and low cost.

FIG. 8 is a block diagram showing the structure of a conventional D/A converter of a PWM type. The D/A converter comprises a data input circuit 1, a counter 2, a pulse generating circuit 3, a selecting and synthesizing circuit 4, power supplies 5a and 5b, and a low-pass filter (LPF) 6. The power supplies 5a and 5b respectively generate voltages V1 and V2 (V1>V2), which are the supply voltage and the ground voltage, for example.

The data input circuit 1 receives digital data set D to be converted to an analog signal, datum by datum, and keeps supplying the digital data set D to the pulse generating circuit 3 in one data conversion period. The "data conversion period" is the period needed to convert the received single piece of digital data set D to an analog value. The data conversion period for n-bit digital data set D is $2^n$ times the clock period of a reference clock CK.

In response to the reference clock CK, the counter 2 repeats the count operation to produce count data A for each data conversion period and supplies the count data A to the pulse generating circuit 3. The counter 2 has a bit structure the number of bits of which matches the number of bits of the digital data set D to be supplied to the data input circuit 1. The counter 2 repeats the count operation on n-bit digital data set D in a period (one data conversion period) that is $2^n$ times the clock period of the reference clock CK.

The pulse generating circuit 3 receives the digital data set D from the data input circuit 1 together with the count data A from the counter 2 and outputs a $2^n$-bit pulse signal P. The total pulse width in one data conversion period varies in accordance with the contents of the digital data set D.

More specifically, the pulse generating circuit 3 divides one data conversion period by the clock period of the reference clock CK to $2^n$ sub periods, and produces the pulse signal P, which rises in each one of the sub periods corresponding to a numeral indicated by the digital data set D. When the digital data set D represents "1", for example, the pulse generating circuit 3 generates the pulse signal P that rises to the high level from the low level only in one clock period during one data conversion period or during $2^n$ clock periods. Likewise, when the digital data set D represents "6", the pulse generating circuit 3 generates the pulse signal P that rises to the high level from the low level only in six clock periods during one data conversion period.

The pair of power supplies 5a and 5b respectively supply the voltages V1 and V2 to the selecting and synthesizing circuit 4. This selecting and synthesizing circuit 4 is comprised of, for example, a pair of switching transistors, which operate in a complementary fashion. This circuit 4 selectively outputs one of the voltages V1 and V2 in response to the pulse signal P produced by the pulse generating circuit 3. The difference between the voltages V1 and V2 is the dynamic range of the output analog signal.

In response to the pulse signal P, the LPF 6 smoothes the two voltages V1 and V2 acquired by the selecting and synthesizing circuit 4 to yield an analog signal voltage Vout corresponding to the digital data set D. The output signal of the selecting and synthesizing circuit 4 is a binary signal in which the values of the two voltages V1 and V2 repeatedly appear in accordance with the duty ratio that is determined by the digital data set D. The output signal of the circuit 4 is put through the LPF 6. Accordingly, the analog signal voltage Vout with the high-frequency component removed and having only the DC component is obtained.

FIG. 9 is a circuit diagram exemplifying the structure of the pulse generating circuit 3, and FIG. 10 is a timing chart for explaining the operation of this circuit 3. In this example, it is assumed for a simpler explanation that 3-bit data is to be processed.

In the case of the 3-bit data structure, the counter 2 operates in an eight-clock period that is designated as one data conversion period. 3-bit count data A (a1, a2, a3) input from the counter 2 is sent to a decoder 7 to be converted to decoded data B (b1, b2, b3) shown in FIG. 10 in each data conversion period. The respective bits of the decoded data B (b1, b2, b3) can be acquired by, for example, the following logical combination.

b1=*a3 b2=*a2·a3 b3=*a1·a2·a3 where *a1, *a2 and *a3 represent the negation of a1, a2 and a3, respectively.

Each bit of the decoded data B (b1, b2, b3) is given to one input terminal of associated NAND gate 8a, 8b and 8c. Further, each bit of 3-bit digital data set D (d1, d2, d3) input from the data input circuit 1 is supplied to the other input terminal of the associated NAND gate 8a, 8b and 8c. The outputs of the NAND gates 8a–8c are supplied to the input terminal of a NAND gate 9 the output of which is sent out as a pulse signal P. Accordingly, the bits of the decoded data B (b1, b2, b3) are synthesized in accordance with the contents of the digital data set D (d1, d2, d3).

The sum of the widths of pulses in the finally produced pulse signal P, which is output during one data conversion period, corresponds to the contents of the digital data set D (d1, d2, d3). When the digital data set D (d1, d2, d3) is "1, 0, 1", for example, b1 and b3 in the decoded data B (b1, b2, b3) are combined. The pulse signal P (1, 0, 1) is produced in the data conversion period of eight clock periods, and the total pulse width corresponds to five clock periods.

The output period of the voltage Vout acquired by converting the digital data set D (d1, d2, d3) matches the period in which the digital data set D (d1, d2, d3) is supplied to the data input circuit 1 and is set by the period of the clock CK input to the counter 2 or the period of the pulse signal P. The frequency of occurrence of falling and rising of the pulse signal P ranges from two to eight at maximum in the data conversion period. When the output period becomes shorter in accordance with over-sampling or the like, therefore, the frequency of the pulse signal P becomes significantly high. The selecting and synthesizing circuit 4, which responds to this pulse signal P, will therefore perform a frequent switching operation, generating switching noise, that contributes to the deformation of the output.

SUMMARY OF THE INVENTION

Accordingly, it is a primary objective of the present invention to eliminate such a frequent switching operation to thereby prevent the switching-noise oriented deformation of the output waveform.

To achieve the above object, a D/A converter according to this invention continuously converts digital data including an appropriate number of bits to an analog value according to the contents of the digital data. The D/A. converter has a pulse generating circuit for generating a negative pulse signal and a positive pulse signal at the time of executing the continuous data conversion. The negative pulse signal rises after a period specified by the digital data in an odd order of the data conversion period and the negative pulse signal falls in an even data conversion period, wherein a period, which is specified by the digital data, remains in the even data conversion period. The positive pulse signal rises in the odd order of the data conversion period such that a period, specified by the digital data, remains in the odd data conversion period, and the positive pulse signal falls after a period specified by the digital data in the even data conversion period. A pulse synthesizer outputs a synthesized pulse signal in response to the difference between the negative pulse signal and the positive pulse signal.

The switching operation is performed in accordance with the negative pulse signal and the positive pulse signal, which repeat rising and falling every data conversion period. This elongates the period for the switching operation, thus reducing switching noise. As the output pulse signal obtained according to the difference between those negative pulse signal and positive pulse signal shows only two level inversions in each data conversion period, the high-frequency component is reduced.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 1:
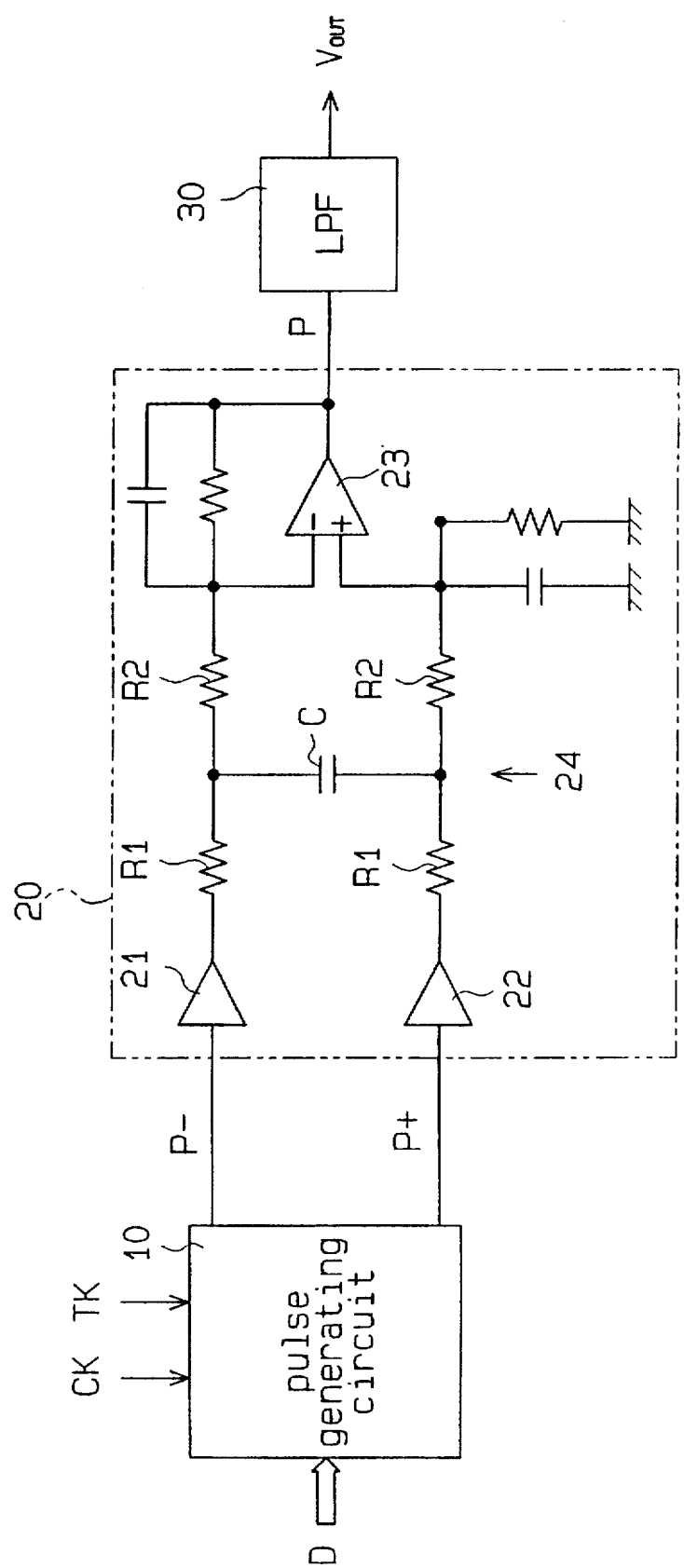
FIG. 1 is a block diagram of a D/A converter according to this invention.

FIG. 1 shows a D/A converter having a 3-bit structure according to this invention. A pulse generating circuit 10 in the D/A converter operates in accordance with a reference clock CK of a given period. In response to input digital data set D, the circuit 10 generates a negative pulse signal P– and a positive pulse signal P+ shown in FIG. 2. The negative pulse signal P– has a data arrangement in which a data arrangement of the positive pulse signal P+ is inverted for every data conversion period.

The data conversion period for this pulse generating circuit 10 is set to $2^n-1$ times the period of the reference clock CK in association with n-bit digital data. A period discrimination signal TK is formed by frequency-dividing the reference clock CK by $2 \cdot (2^n-1)$, and is inverted every data conversion period. When digital data set D comprises three bits, for example, one data conversion period becomes equal to seven clock periods of the reference clock CK, and the period discrimination signal TK of 14 clock periods, which is inverted every seven clock periods, is produced.

The negative pulse signal P– goes low in one data conversion period in accordance with the period specified by the digital data set D. Specifically, this signal P– goes low at the beginning of every odd order (ODD) of consecutive data conversion periods, and goes low at the end of every even one (EVEN) of the consecutive data conversion periods.

The positive pulse signal P+ goes high in one data conversion period in accordance with the period specified by the digital data set D. Specifically, this signal P+ goes high at the end of every odd order (ODD) of consecutive data conversion periods, and goes high at the beginning of every even period (EVEN) of the consecutive data conversion periods.

Figure 2:
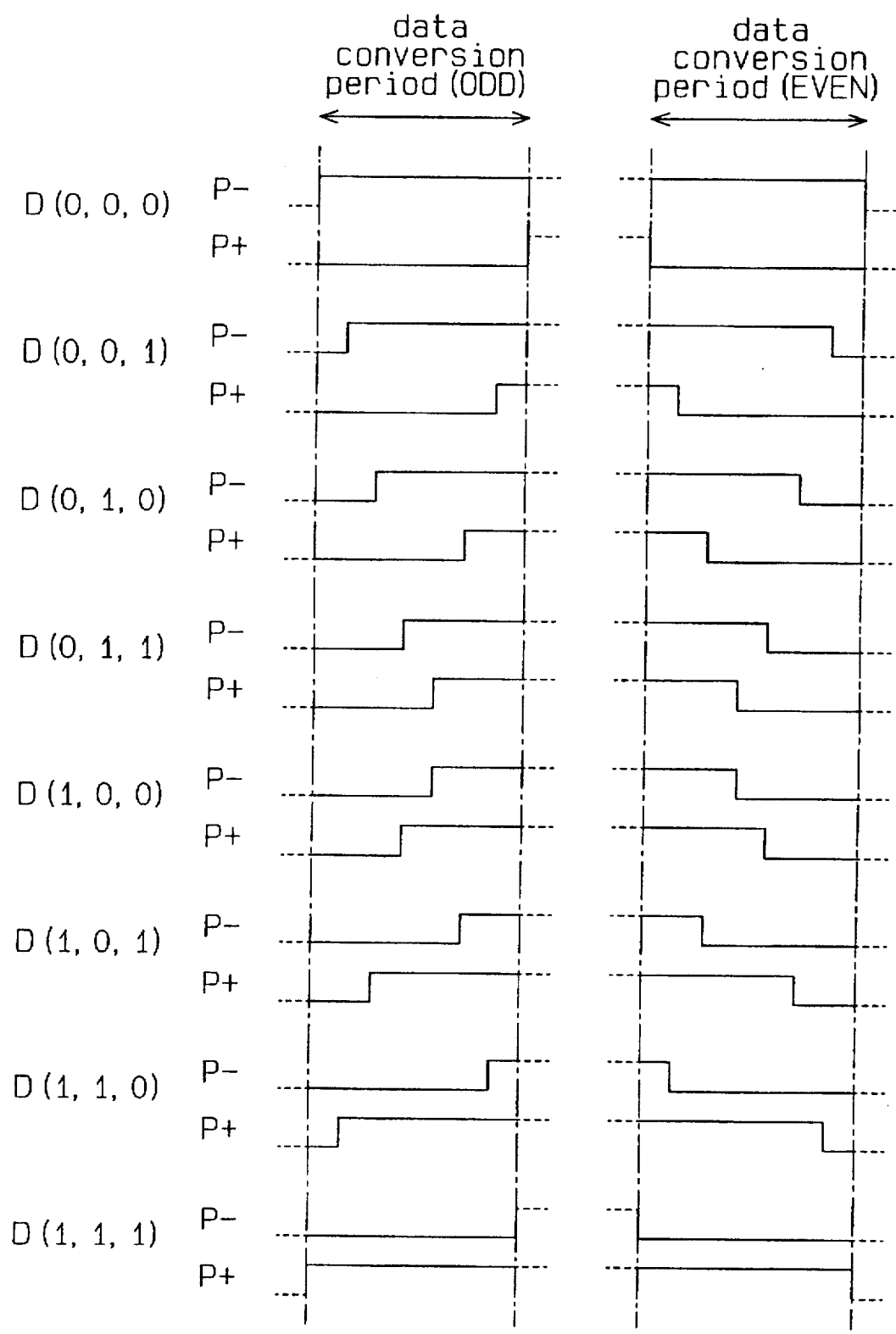
FIG. 2 is a waveform diagram showing pulse signals to be input to a pulse generating circuit in the D/A converter.

With regard to 3-bit digital data set D (d1, d2, d3), for example, eight types of negative pulse signals P– and positive pulse signals P+ are generated respectively in the odd order of the data conversion period (ODD) and in the even order of the data conversion period (EVEN), as shown in FIG. 2. The negative pulse signals P– and positive pulse signals P+ go low at the beginning of each odd order of the data conversion period (ODD) and high at the end thereof and go high at the beginning of each even order of the data conversion period (EVEN) and low at the end thereof. Therefore, the negative pulse signals P– and positive pulse signals P+ are not inverted at the transition of data conversion periods or when data conversion periods are switched from the odd period to the even period or vice versa.

A pulse synthesizer 20 shown in FIG. 1 includes a pair of buffers 21 and 22 and a differential amplifier 23. This pulse synthesizer 20 receives the negative pulse signal P– and positive pulse signal P+ to produce a synthesized pulse signal P. The buffers 21 and 22 respectively receive the negative pulse signal P– and the positive pulse signal P+ to send their outputs to the negative input terminal and the positive input terminal of the differential amplifier 23.

The differential amplifier 23 outputs different voltages in accordance with the difference between the negative pulse signal P– and the positive pulse signal P+. Specifically, the differential amplifier 23 outputs a negative supply voltage $-V_D$ (see FIG. 3) when the level of the negative pulse signal P– is higher and outputs a positive supply voltage $+V_D$ when the level of the positive pulse signal P+ is higher. When the negative pulse signal P– and the positive pulse signal P+ are at the same level, the differential amplifier 23 outputs a ground potential ±0. Accordingly, the synthesized pulse P, which has an integrated value in one data conversion period associated with the digital data set D, is formed.

Figure 3:
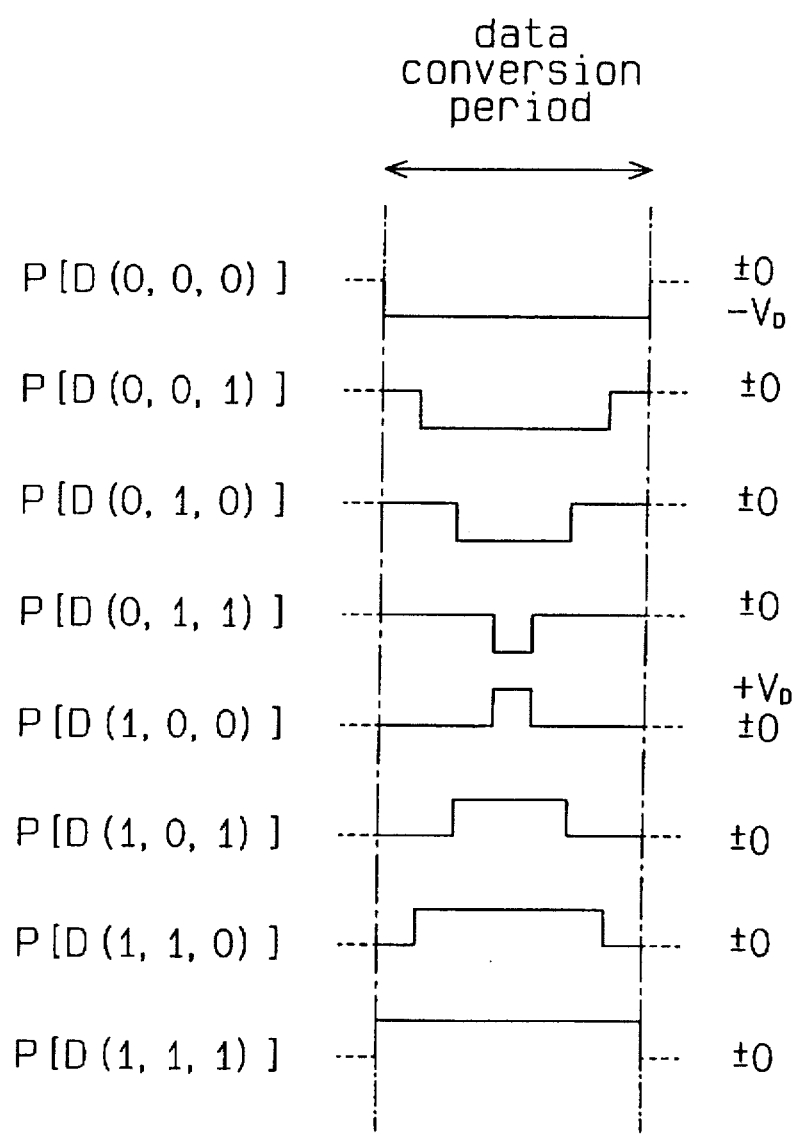
FIG. 3 is a waveform diagram showing pulse signals which are output from the pulse generating circuit.

With regard to the negative pulse signals P– and positive pulse signals P+ shown in FIG. 2, which are associated with 3-bit digital data set D (d1, d2, d3), for example, eight kinds of synthesized pulses P shown in FIG. 3 are produced. The synthesized pulses P always have a level of ±0 at the beginning and end of each data conversion period and do not change their values at the transitional timing of data conversion periods.

The pulse synthesizer 20 in FIG. 1 further includes a low-pass filter (LPF) 24 provided between the pair of buffers 21 and 22 and the differential amplifier 23. The LPF 24 is comprised of resistors and a capacitor. Specifically, two resistors R1 and R2 are connected in series to the output of each buffer 21 or 22 and a capacitor C is connected to the nodes of the two pairs of resistors R1 and R2 connected in series, thus constituting an integration circuit. This structure attenuates the high-frequency components in the negative pulse signal P– and the positive pulse signal P+ at the input stage of the differential amplifier 23. Accordingly, the synthesized pulse P output from the differential amplifier 23 has an attenuated high-frequency components.

A low-pass filter (LPF) 30 smoothes the synthesized pulse P output from the pulse synthesizer 20 by removing the high-frequency component therefrom to generate an analog signal voltage Vout with a constant level. The smoothing of the synthesized pulse P is easily accomplished because the inversion of the synthesized pulse P takes place twice in every data conversion period in the LPF 30 in addition to the attenuation of the high-frequency components of the synthesized pulse P effected by the LPF 24 in the pulse synthesizer 20.

According to the above-described structure, the buffers 21 and 22 in the pulse synthesizer 20 are driven by the peculiar negative pulse signal P– and positive pulse signal P+ whose data values are never inverted at the transitional point between data conversion periods but are inverted only once in each data conversion period. This design reduces the switching operations of the buffers 21 and 22, thus reducing switching noise.

Figure 8:
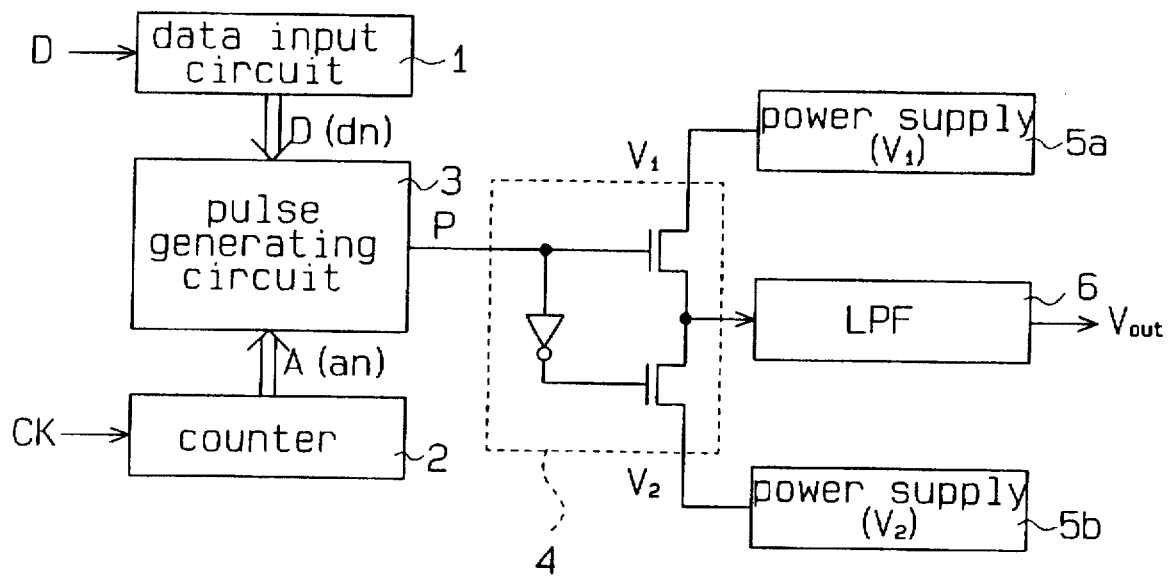
FIG. 8 is a block diagram of a conventional D/A converter.
Figure 9:
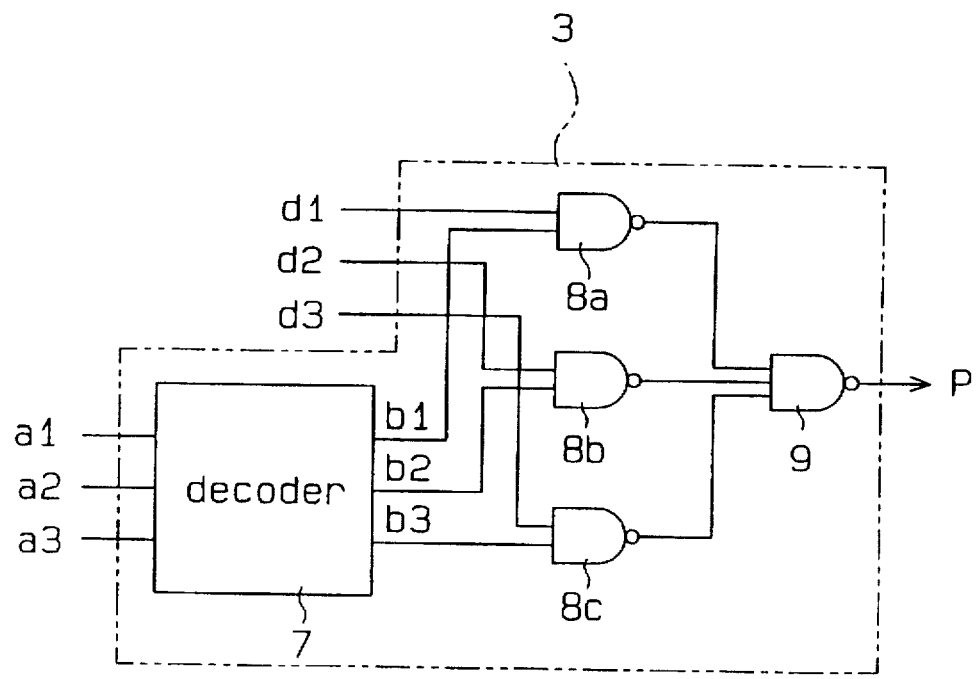
FIG. 9 is a circuit diagram of a pulse generating circuit in the conventional D/A converter.
Figure 10:
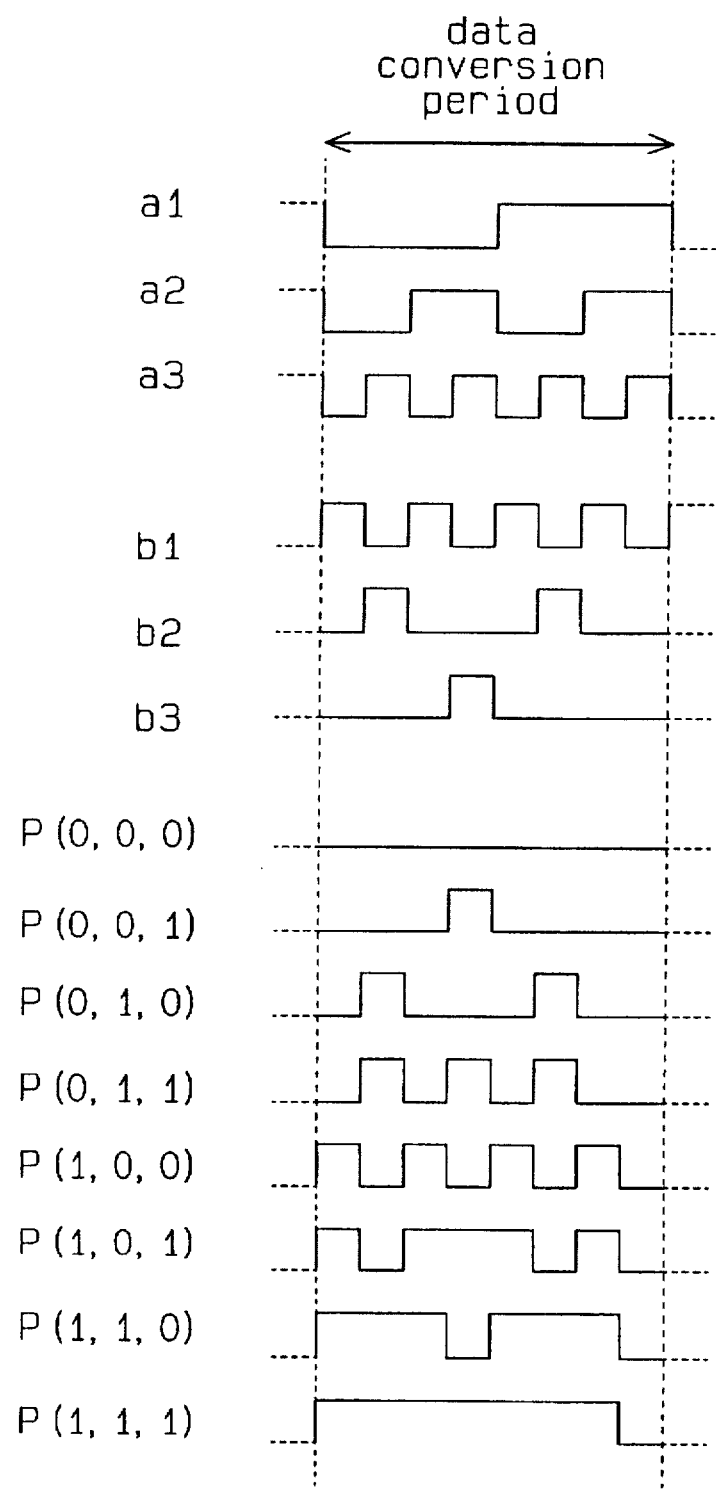
FIG. 10 is a signal waveform diagram for explaining the operation of the pulse generating circuit in FIG. 9.

The value of the synthesized pulse P output from the pulse synthesizer 20 is never inverted at the transitional point between data conversion periods but is inverted merely twice in each data conversion period. Accordingly, the D/A converter reduces the high-frequency components included in the output analog signal in a larger extent as compared with the conventional D/A converter shown in FIG. 8.

Figure 4:
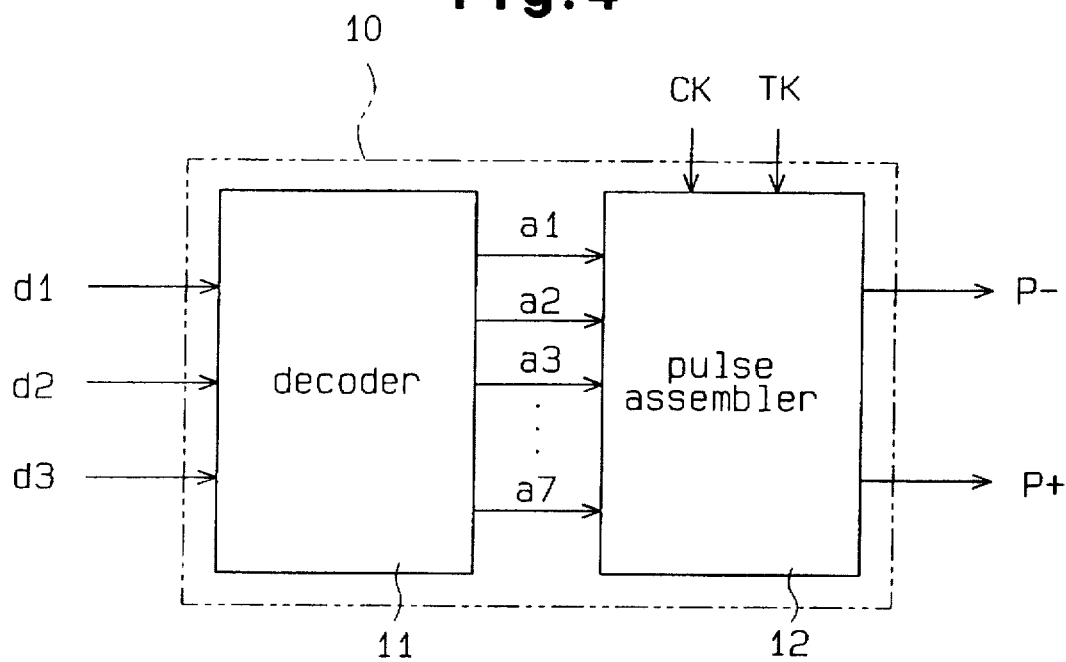
FIG. 4 is a block diagram illustrating the internal structure of the pulse generating circuit.

FIG. 4 illustrates the pulse generating circuit 10, which is designed to have a 3-bit structure for the sake of a simpler explanation. The pulse generating circuit 10 has a decoder 11 and a pulse assembler 12. The decoder 11 receives 3-bit digital data set D (d1, d2, d3) and sends 7-bit decoded data A (a1, a2, . . . , a7) in which a plurality of ones can be consecutively arranged in accordance with the contents of the digital data set D (d1, d2, d3).

Figure 6:
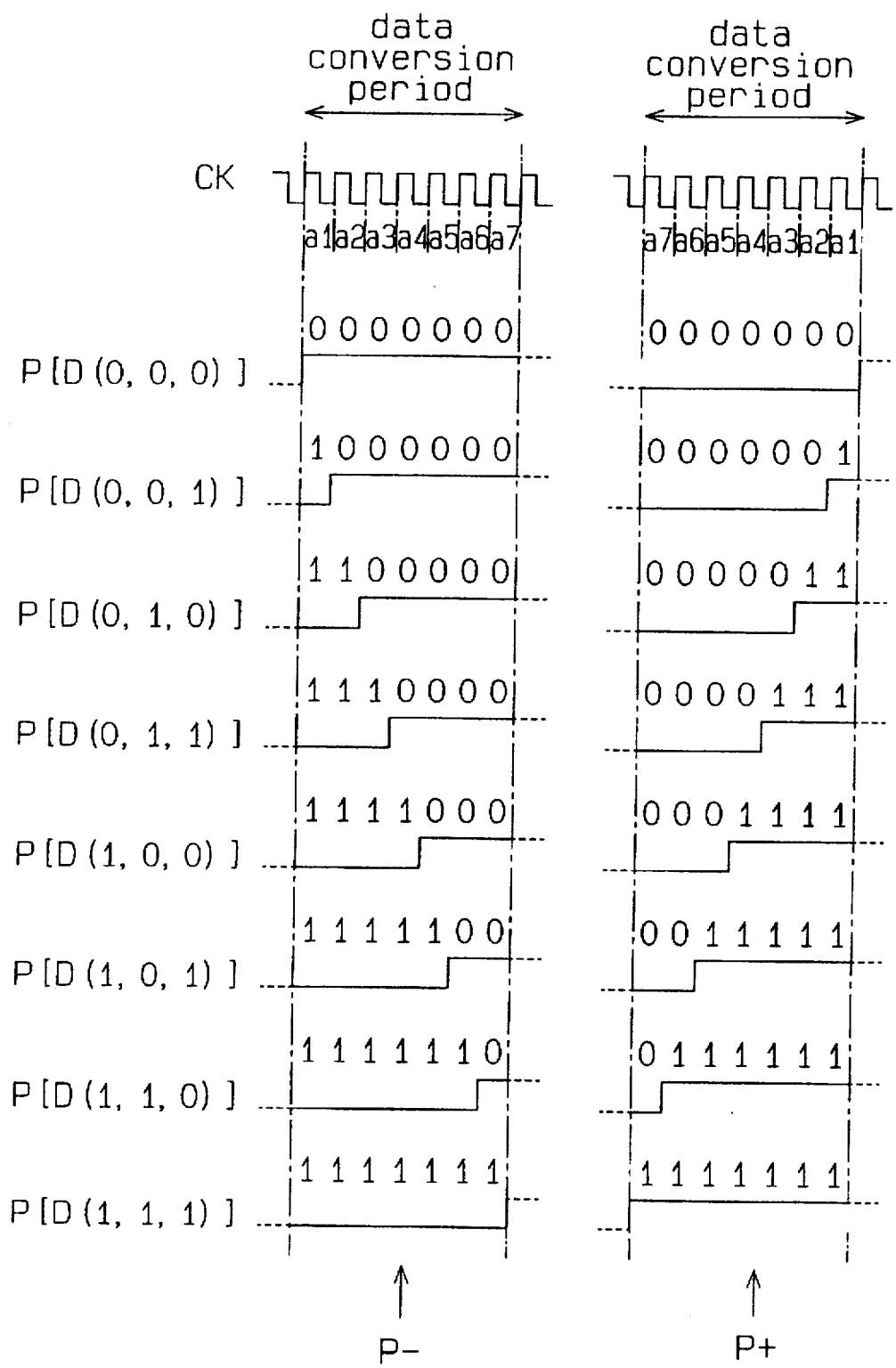
FIG. 6 is a signal waveform diagram for explaining the operation of the pulse generating circuit in FIG. 4.

As apparent from FIG. 6, the 7-bit decoded data set A (a1, a2, . . . , a7) is produced in such a way that in response to the increase of the value of the digital data set D (d1, d2, d3) by one, the number of ones arranged in a row increases by one in order from the position of a1. When the digital data set D (d1, d2, d3) represents "2", for example, the decoded data set becomes A (1, 1, 0, 0, 0, 0, 0), and when it represents "5", the decoded data set becomes A (1, 1, 1, 1, 1, 0, 0).

The pulse assembler 12 assembles and output a negative pulse signal P– and a positive pulse signal P+ by arranging the 7-bit decoded data set A (a1, a2, . . . , a7), output from the decoder 11 in the period, according to the reference clock CK. FIG. 6 shows negative pulse signals P– and positive pulse signals P+ in the odd data conversion period. Those signals P+ and P– are inverted at the timing of transition between "1" and "0".

The pulse assembler 12 assembles four kinds of pulse signals for one decoded data set A (a1, a2, . . . , a7). Those pulse signals are obtained by the combination of two kinds of pulse signals, which have the same arrangement as or the inverted arrangement to the decoded data and another two kinds of pulse signals whose polarities are inverted or not inverted every data conversion period.

In the odd order of the data conversion period (ODD) shown in FIG. 6, for example, the negative pulse signal P– is assembled by arranging the decoded data set A (a1, a2, a7) from a1 to a7 in order and making the pulses go high from the low level at the timing of transition between "1" and "0". The positive pulse signal P+ is assembled by arranging the decoded data set A (a1, a2, . . . , a7) in the reverse order from a7 to a1 and letting the pulses go high from the low level at the timing of transition between "1" and "0".

In the even order of the data conversion period (EVEN) (not shown), the negative pulse signal P– and the positive pulse signal P+ are assembled by arranging the decoded data set A (a1, a2, . . . , a7) in the same way as discussed before and making the pulses go low from the high level at the timing of transition between "1" and "0". However, it is noted that the arranging orders of the decoded data set A (a1, a2, . . . , a7) in the even order of the data conversion period (EVEN) should be reversed to those in the odd order of the data conversion period (ODD).

As in the case of FIG. 2, therefore, 4 (sets)×8 pulse signals P are generated for 3-bit digital data set D (d1, d2, d3). Since such the pulse generating circuit 10 receives the digital data set D (d1, d2, d3) all at once and generates the decoded data set A (a1, a2, . . . , a7), it has fewer components that operate at high frequency. This results in hardly generating switching noise.

Figure 5:
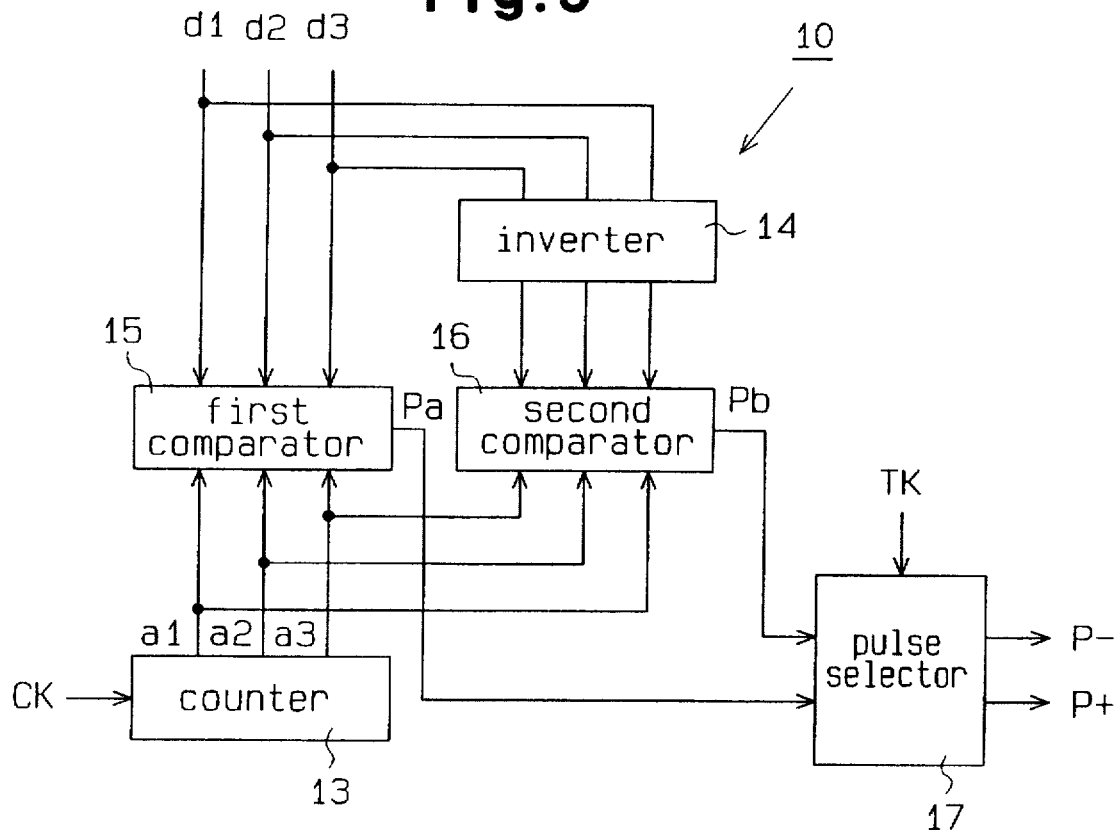
FIG. 5 is a block diagram showing another example of a D/A converter having a pulse generating circuit.

FIG. 5 is a block diagram showing another example of a pulse generating circuit which is also designed to have a 3-bit structure for the sake of a simpler explanation. This pulse generating circuit 10 comprises a counter 13, an inverter 14, a pair of comparators 15 and 16 and a pulse selector 17.

The counter 13 repeats a count operation in response to the reference clock CK to generate 3-bit count data set A (a1, a2, a3) that varies according to the reference clock CK. This counter 13 is reset in every seven clock periods and thus operates in a data conversion period. For instance, when all the bits of the count data set A (a1, a2, a3) represent "1", the counter 13 resets all the bits of the counter 13 itself to "0". The inverter 14 inverts the individual bits of received digital data set D (d1, d2, d3), and supplies the resultant data to the second comparator 16.

Figure 7:
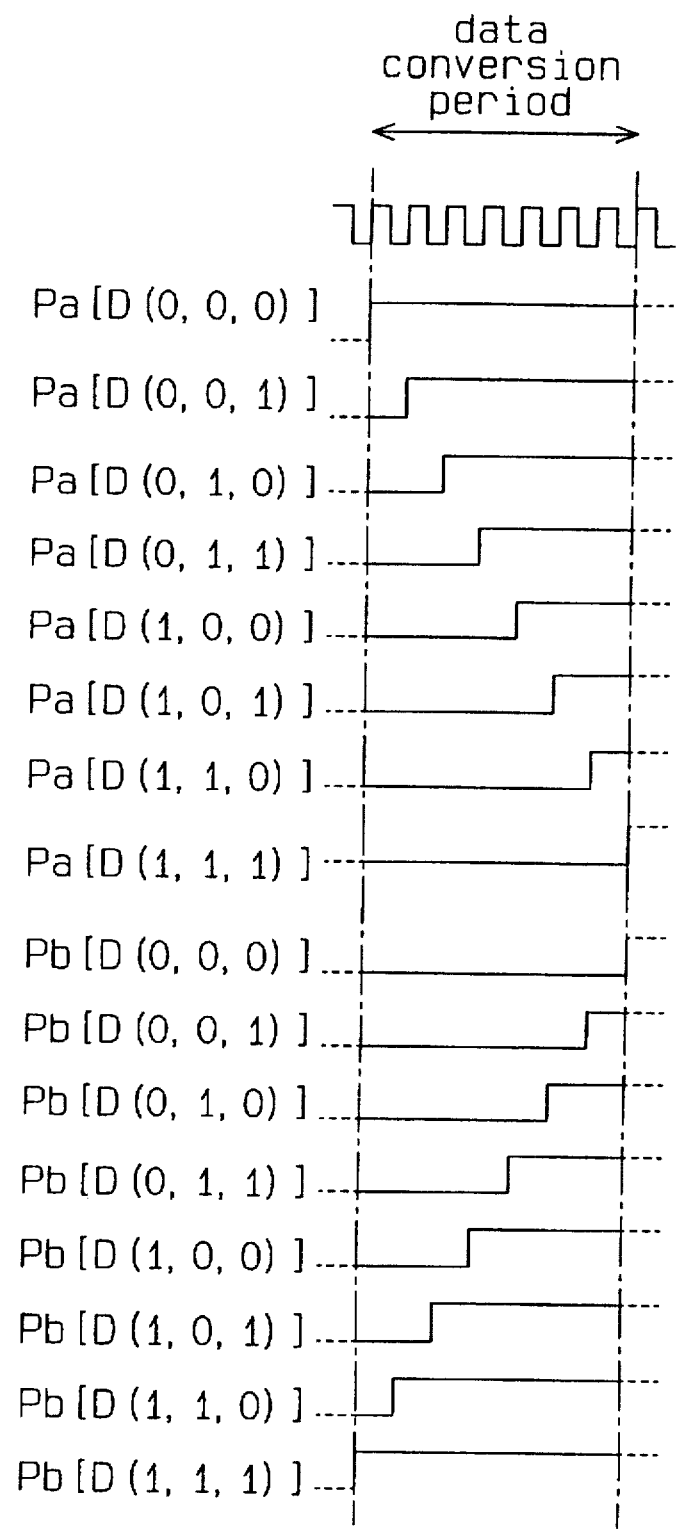
FIG. 7 is a signal waveform diagram for explaining the operation of the pulse generating circuit in FIG. 5.

The first comparator 15 compares the count data set A (a1, a2, a3) with the digital data set D (d1, d2, d3) to generate a comparison signal Pa (see FIG. 7) that goes high from the low level at the timing when the count data set A (a1, a2, a3) matches with the digital data set D (d1, d2, d3). The second comparator 16 compares the count data set A (a1, a2, a3) with the inverted data of the digital data set D (d1, d2, d3) to generate a comparison signal Pb (see FIG. 7) that goes high from the low level at the timing when the count data set A (a1, a2, a3) matches with the inverted data of the digital data set D (d1, d2, d3).

In response to the period discrimination signal TK inverted every data conversion period, the pulse selector 17 alternately receives the comparison signals Pa and Pb, and inverts them, as needed, to generate the negative pulse signal P− and positive pulse signal P+. In the odd data conversion period, for example, the comparison signals Pa and Pb are output directly as the negative pulse signal P− and positive pulse signal P+, respectively. In the even data conversion period, on the other hand, the comparison signal Pb is inverted and is then output as the negative pulse signal P− and the comparison signal Pa is inverted and is then output as the positive pulse signal P+. Like the pulse generating circuit shown in FIG. 4, therefore, the pulse generating circuit 10 of FIG. 5 generates 4 (sets)×8 pulse signals for 3-bit digital data set D (d1, d2, d3). Even if the number of bits in input digital data set D increases, such the pulse generating circuit can easily deal with the increased bits, without significantly increasing the circuit scale, by merely increasing the bits in the counter 13 and the comparators 15 and 16.

In the present pulse generating circuit, switching noise is produced in the counter 13 that operates based on the reference clock CK. However, because the power consumption of the counter 13 is sufficiently small as compared with that of the buffers 21 and 22 of the pulse synthesizer 20, the noise level is negligibly small.

Although the D/A converter the foregoing description takes a 3-bit structure, it may take a 4-bit structure as well.

What is claimed is:

1. A digital-to-analog (D/A) converter for converting digital data including an appropriate number of bits to an analog value according to the contents of the digital data every data conversion period, the D/A converter comprising:

a pulse generating circuit for generating a negative pulse signal and a positive pulse signal at the time of executing a continuous data conversion including an odd order and even order of the data conversion period which has a predetermined constant length, wherein the negative pulse signal rises after a period specified by the digital data in the odd data conversion period, and the negative pulse signal falls in the even data conversion period, wherein a period, which is specified by the digital data, remains in the even data conversion period, wherein the positive pulse signal rises in the odd order of the data conversion period such that a period, specified by the digital data, remains in the odd data conversion period, and the positive pulse signal falls after a period specified by the digital data in the even data conversion period; and a pulse synthesizer for synthesizing the negative pulse signal and the positive pulse signal and for providing a synthesized pulse signal in response to the difference between the negative pulse signal and the positive pulse signal.

2. The D/A converter according to claim 1, wherein the pulse synthesizer includes a differential amplifier having a positive input terminal for receiving the positive pulse signal and a negative input terminal for receiving the negative pulse signal.

3. The D/A converter according to claim 2, wherein the pulse generating circuit includes:

a decoder for generating an decoded data having a predetermined number of bits, the predetermined number of bits being less by one than the number of variety of contents represented by the digital data; and a pulse assembler for assembling the negative pulse signal by arranging the decoded data in a first order during the data conversion period and for assembling the positive pulse signal by arranging the decoded data in a second order opposite the first order during the data conversion period.

4. The D/A converter according to claim 2, wherein the pulse generating circuit includes:

a counter for executing a count operation according to a reference clock signal;

a first comparator for generating a first comparison signal, the level of the first comparison signal altering in a timing when the counted number coincides with the digital data;

a second comparator for generating a second comparison signal, the level of the second comparison signal altering in a timing when the counted number coincides with the inverted digital data; and a pulse selector for transmitting the negative pulse signal and the positive pulse signal by alternatively receiving the first and second comparison signals and selectively inverting the received signals.

* * * * *